(12) United States Patent
Takida et al.

(10) Patent No.: US 8,619,925 B2
(45) Date of Patent: Dec. 31, 2013

(54) AUTOMATIC GAIN CONTROL CIRCUIT AND RECEIVER CIRCUIT

(75) Inventors: Takayuki Takida, Tokyo (JP);
Masanori Furuta, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 918 days.

(21) Appl. No.: 12/719,327

(22) Filed: Mar. 8, 2010

(65) Prior Publication Data
US 2010/0296612 A1 Nov. 25, 2010

(30) Foreign Application Priority Data

May 21, 2009 (JP) ................................ P2009-122993

(51) Int. Cl.
*H04L 27/08* (2006.01)
(52) U.S. Cl.
USPC .......................................................... 375/345
(58) Field of Classification Search
USPC ......... 375/137, 262, 333, 341, 343, 344, 345, 375/350, 355, 376; 331/2, 16, 17, 25, 66, 331/74, 175
See application file for complete search history.

(56) References Cited

U.S. PATENT DOCUMENTS

| | | | | | |
|---|---|---|---|---|---|
| 3,845,385 | A | * | 10/1974 | Ebrecht | 324/610 |
| 3,991,283 | A | * | 11/1976 | Itoh et al. | 369/47.16 |
| 5,488,379 | A | * | 1/1996 | Jackson et al. | 342/359 |
| 5,901,347 | A | * | 5/1999 | Chambers et al. | 455/234.1 |
| 6,060,950 | A | * | 5/2000 | Groe | 330/279 |
| 2002/0141517 | A1 | * | 10/2002 | Hayashi | 375/345 |
| 2002/0186081 | A1 | * | 12/2002 | Kawabe et al. | 330/137 |
| 2006/0265491 | A1 | * | 11/2006 | Litwin | 709/224 |
| 2008/0069183 | A1 | * | 3/2008 | Terada | 375/137 |
| 2010/0048155 | A1 | * | 2/2010 | Wang | 455/234.1 |

FOREIGN PATENT DOCUMENTS

| | | |
|---|---|---|
| JP | 11-195941 | 7/1999 |
| JP | 11-234069 | 8/1999 |
| JP | 2007-028473 | 2/2007 |

* cited by examiner

*Primary Examiner* — Sam K Ahn
*Assistant Examiner* — Syed Haider
(74) *Attorney, Agent, or Firm* — White & Case LLP

(57) ABSTRACT

An automatic gain control circuit configured so that a response time is reduced until a gain converges is disclosed. A variable gain amplifier is configured so that a gain is varied by a first control signal. A detector circuit detects an intensity of an output signal of the variable gain amplifier. A comparator compares an output signal of the detector circuit with a reference signal. An integrator integrates a signal corresponding to an output signal of the comparator, and outputs an integration result to the variable gain amplifier as the first control signal. A loop gain control unit, connected between the comparator and the integrator, is configured so that a loop gain is varied by a second control signal. A level detection unit detects an intensity of an output signal of the integrator and outputs a detection result to the loop gain control unit as the second control signal.

11 Claims, 7 Drawing Sheets

AUTOMATIC GAIN CONTROL CIRCUIT AND RECEIVER CIRCUIT

CROSS REFERENCE TO RELATED APPLICATION

This application is based upon and claims the benefit of priority from the prior Japanese Patent Application No. 2009-122993, filed on May 21, 2009, the entire contents of which are incorporated herein by reference.

FIELD OF THE INVENTION

The invention relates to an automatic gain control circuit, and a receiver circuit.

DESCRIPTION OF THE BACKGROUND

In an automatic gain control circuit, the output level from a variable gain amplifier is maintained constant by comparing the output level from the variable gain amplifier with a reference signal, and controlling the gain of the variable gain amplifier so that the output level from the variable gain amplifier matches a reference value.

In the automatic gain control circuit disclosed in Japanese Patent Application Publication No. 11-195941, a band-pass filtering process capable of sufficiently suppressing the interference of adjacent channels is performed on the reception signal subjected to orthogonal detection, a desired wave power, and an interfering wave power are obtained, and a loop filter coefficient is calculated with reference to such power values to perform the gain control that follows the desired wave power fluctuation without following the undesired wave power.

However, in the automatic gain control circuit, the response time until the gain of the variable gain amplifier converges increases if the amplitude of the input signal is small since the gain of the variable gain amplifier is controlled by an integrating operation of the loop filter.

In the automatic gain control circuit disclosed in Japanese Patent Application Publication No. 11-195941, the response time until the gain of the variable gain amplifier converges cannot be reduced since the loop gain of the loop filter is controlled based on the magnitude of the desired wave power and the undesired wave power.

The input/output characteristics of the automatic gain control circuit are generally known to be a linear response in the logarithmic region. Thus, the response time until the gain of the variable gain amplifier converges can be reduced by linear/logarithmic converting the output level from the variable gain amplifier, but the scale of the circuit becomes large when realizing the linear/logarithmic conversion through digital signal processing.

SUMMARY OF THE INVENTION

An automatic gain control circuit of one aspect of the invention includes: a variable gain amplifier configured so that a gain is varied by a first control signal; a detector circuit to detect an intensity of an output signal of the variable gain amplifier; a comparator to compare an output signal of the detector circuit with a reference signal; an integrator to integrate a signal corresponding to an output signal of the comparator, and output an integration result to the variable gain amplifier as the first control signal; a loop gain control unit, connected between the comparator and the integrator, and configured so that a loop gain is varied by a second control signal; and a level detection unit to detect an intensity of an output signal of the integrator, and output a detection result to the loop gain control unit as the second control signal.

The automatic gain control circuit of another aspect of the invention includes: a variable gain amplifier configured so that a gain is varied by a first control signal; a detector circuit to detect an intensity of an output signal of the variable gain amplifier; a comparator to compare the output signal of the detector circuit with a reference signal; an integrator to integrate a signal corresponding to an output signal of the comparator, and output an integration result to the variable gain amplifier as the first control signal; and a loop gain control unit, connected between the comparator and the integrator, and configured so that a loop gain is varied by a lock detection signal of a PLL circuit.

A receiver circuit of an aspect of the invention includes: a low noise amplifier to amplify a reception signal; a first local oscillator to generate a first local oscillation signal based on an output of a first PLL circuit;
a mixer to down-convert the reception signal by mixing the reception signal and the first local oscillation signal; a second local oscillator to generate a second local oscillation signal based on an output of a second PLL circuit; an AD converter, to operate in synchronization with a clock signal generated from the second local oscillation signal, and convert an analog signal down-converted by the mixer to a digital signal; and an automatic gain control circuit to operate in synchronization with the clock signal generated from the second local oscillation signal, and control a gain of the digital signal output from the AD converter while controlling a loop gain of a feedback loop based on a lock detection signal of the first PLL circuit.

DETAILED DESCRIPTION OF THE INVENTION

An automatic gain control circuit according to the embodiments of the invention will be described with reference to the drawings.

First Embodiment

A first embodiment of the invention will be described with reference to FIGS. 1 and 2.

Figure 1:
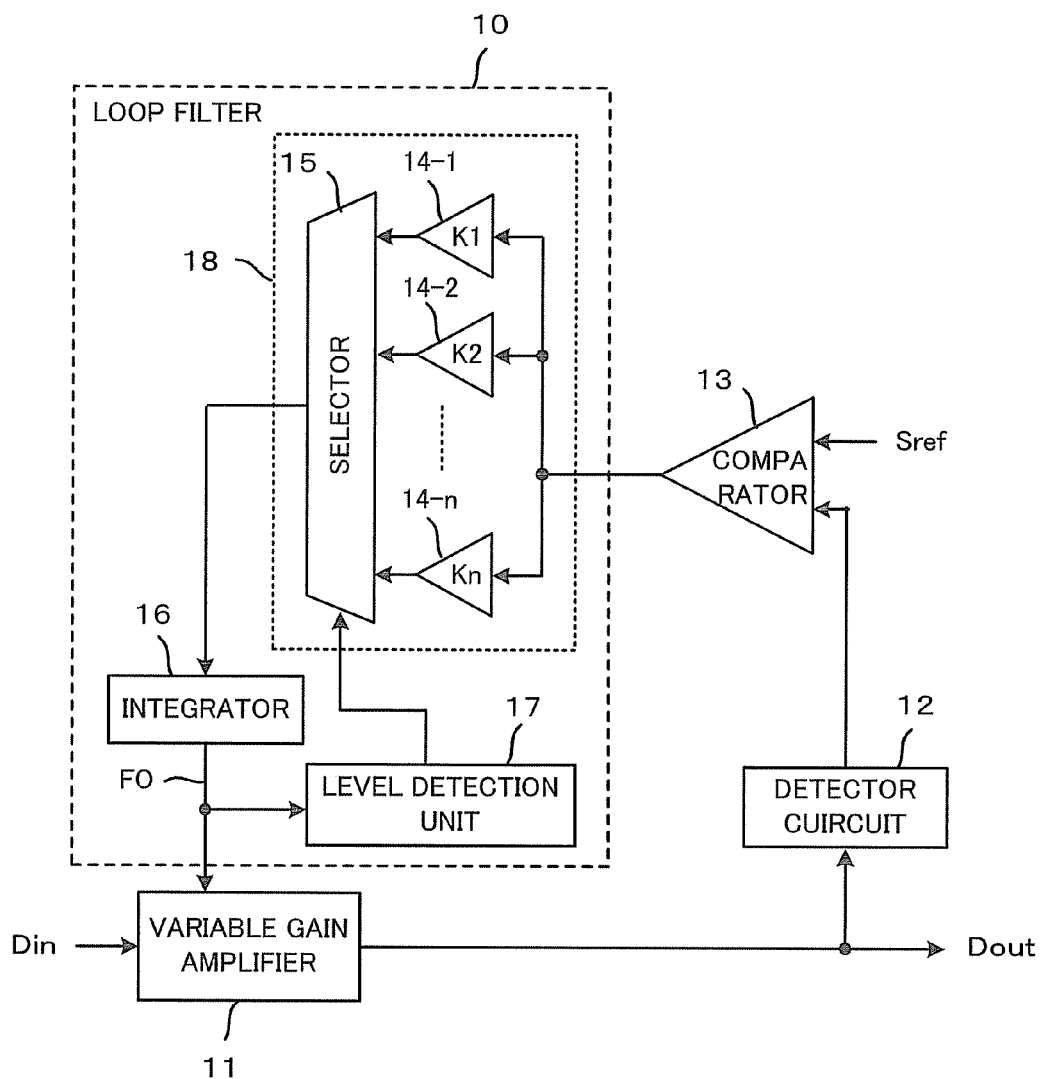
FIG. 1 is a block diagram showing a schematic configuration of an automatic gain control circuit according to a first embodiment of the invention.

FIG. 1 is a block diagram showing a schematic configuration of an automatic gain control circuit according to the first embodiment of the invention.

In FIG. 1, the automatic gain control circuit includes a variable gain amplifier 11, a detector circuit 12, a comparator 13, and a loop filter 10. The automatic gain control circuit can perform the automatic gain control in the digital signal process, and an input signal Din and an output signal Dout can be provided in digital values.

The variable gain amplifier 11 can vary the gain when amplifying the input signal Din. The detector circuit 12 detects the amplitude of the signal amplified by the variable gain amplifier 11, and outputs the detection result to the comparator 13. The comparator 13 compares the amplitude of the signal detected by the detector circuit 12 with a reference signal Sref, and outputs the comparison result to the loop filter 10. The loop filter 10 can control the gain of the variable gain amplifier 11 based on the integration result of the output from the comparator 13.

The loop filter 10 includes an integrator 16, a level detection unit 17, and a loop gain control unit 18. The integrator 16 integrates the output from the comparator 13 in which the loop gain is controlled by the loop gain control unit 18, and controls the gain of the variable gain amplifier 11 based on the integration result. The level detection unit 17 can detect the signal intensity of the output from the integrator 16. The loop gain control unit 18 can control the loop gain of the loop filter 10 based on the detection result by the level detection unit 17.

The loop gain control unit 18 includes coefficient multipliers 14-1 to 14-$n$, and a selector 15. The coefficient multipliers 14-1 to 14-$n$ can respectively multiply a filter coefficient K1 to Kn ($n$ is an integer greater than or equal to two) to the output from the comparator 13. The selector 15 can select the filter coefficient K1 to Kn to multiply to the output from the comparator 13 based on the detection result of the level detection unit 17. The filter coefficients K1 to Kn can be set to satisfy the condition K1<K2<K3< . . . <Kn.

A gain control signal FO (first control signal) is input from the loop filter 10 to the variable gain amplifier 11, and the input signal Din is input to the variable gain amplifier 11. When the input signal Din is input to the variable gain amplifier 11, the output signal Dout is generated by amplifying the input signal Din while controlling the gain in the loop filter 10, and output to the detector circuit 12. When the output signal Dout is output to the detector circuit 12, the amplitude of the output signal Dout is detected, and the detection result is output to the comparator 13.

After being output to the comparator 13, the detection result on the amplitude of the output signal Dout is compared with the reference signal Sref, and the comparison result is output to the loop filter 10. When the output from the comparator 13 is output to the loop filter 10, the filter coefficients K1 to Kn are respectively multiplied to the output from the comparator 13, and the multiplication results are output to the selector 15.

The gain control signal FO from the loop filter 10 is output to the level detection unit 17, and a signal intensity GA of the gain control signal FO is detected. After the signal intensity GA of the gain control signal FO is detected, a selection signal (second control signal) corresponding to such signal intensity GA is generated, and output to the selector 15. If TH1<TH2<TH3< . . . <THn−1, for example, the filter coefficients K1 to Kn can be selected in the following manner according to the signal intensity GA of the gain control signal FO.

$GA < TH1$ → $K1$
$TH1 \leq GA < TH2$ → $K2$
$TH2 \leq GA < TH3$ → $K3$
...
$THn-1 \leq GA$ → $Kn$ When the selection signal is output to the selector 15, one of the outputs from the coefficient multipliers 14-1 to 14-$n$ is selected according to such selection signal, and output to the integrator 16. When the signal selected by the selector 15 is output to the integrator 16, such signal is integrated to generate the gain control signal FO, which is then output to the variable gain amplifier 11 and the level detection unit 17. When the gain control signal FO is output to the variable gain amplifier 11, the gain of the variable gain amplifier 11 is controlled so that the amplitude of the output signal Dout matches the reference signal Sref.

Since the gain control signal FO becomes large if the amplitude of the input signal Din is small, the filter coefficients K1 to Kn can be switched to extend the integrating band of the integrator 16, and the cutoff frequency of the loop filter 10 can be stabilized. As a result, the fluctuation in the response time due to the intensity fluctuation of the input signal Din can be suppressed, and the response time until the gain of the variable gain amplifier 11 converges can be reduced.

Figure 2:
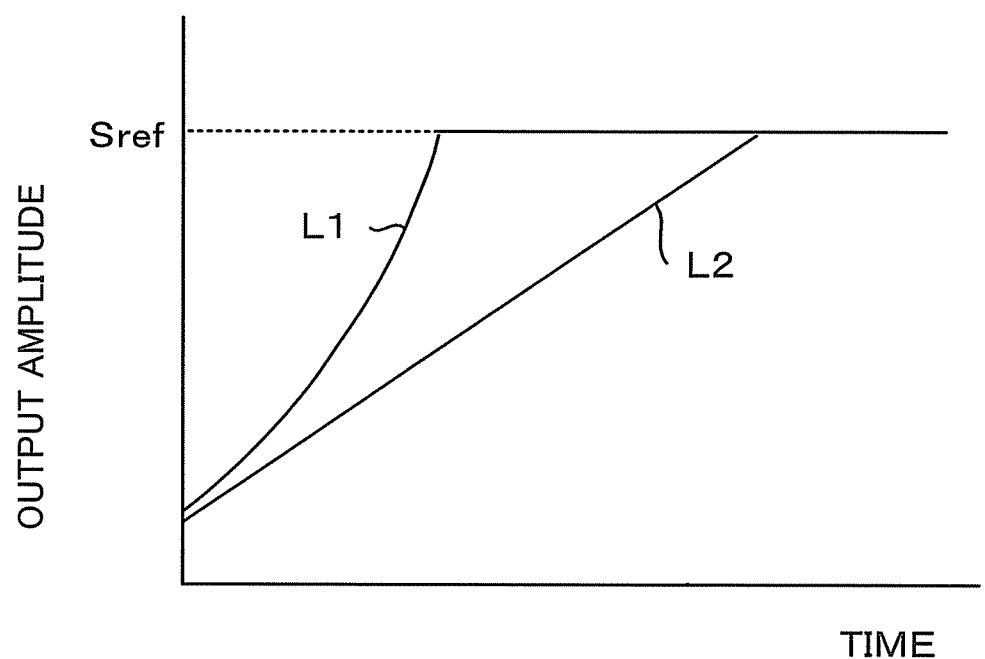
FIG. 2 is a view showing a response time until an output amplitude of a variable gain amplifier of FIG. 1 converges in comparison to a conventional example.

FIG. 2 is a view showing the response time until the output amplitude of the variable gain amplifier of FIG. 1 converges in comparison to the conventional example.

In FIG. 2, the output amplitude of the variable gain amplifier 11 of when the amplitude of the input signal Din is small linearly increases if the loop gain control unit 18 of FIG. 1 is not present (L2). If the loop gain control unit 18 of FIG. 1 is present, on the contrary, the output amplitude of the variable gain amplifier 11 of when the amplitude of the input signal Din is small exponentially increases (L1), so that the response time until the output amplitude of the variable gain amplifier 11 converges can be reduced.

Second Embodiment

A second embodiment of the invention will be described with reference to FIG. 3.

Figure 3:
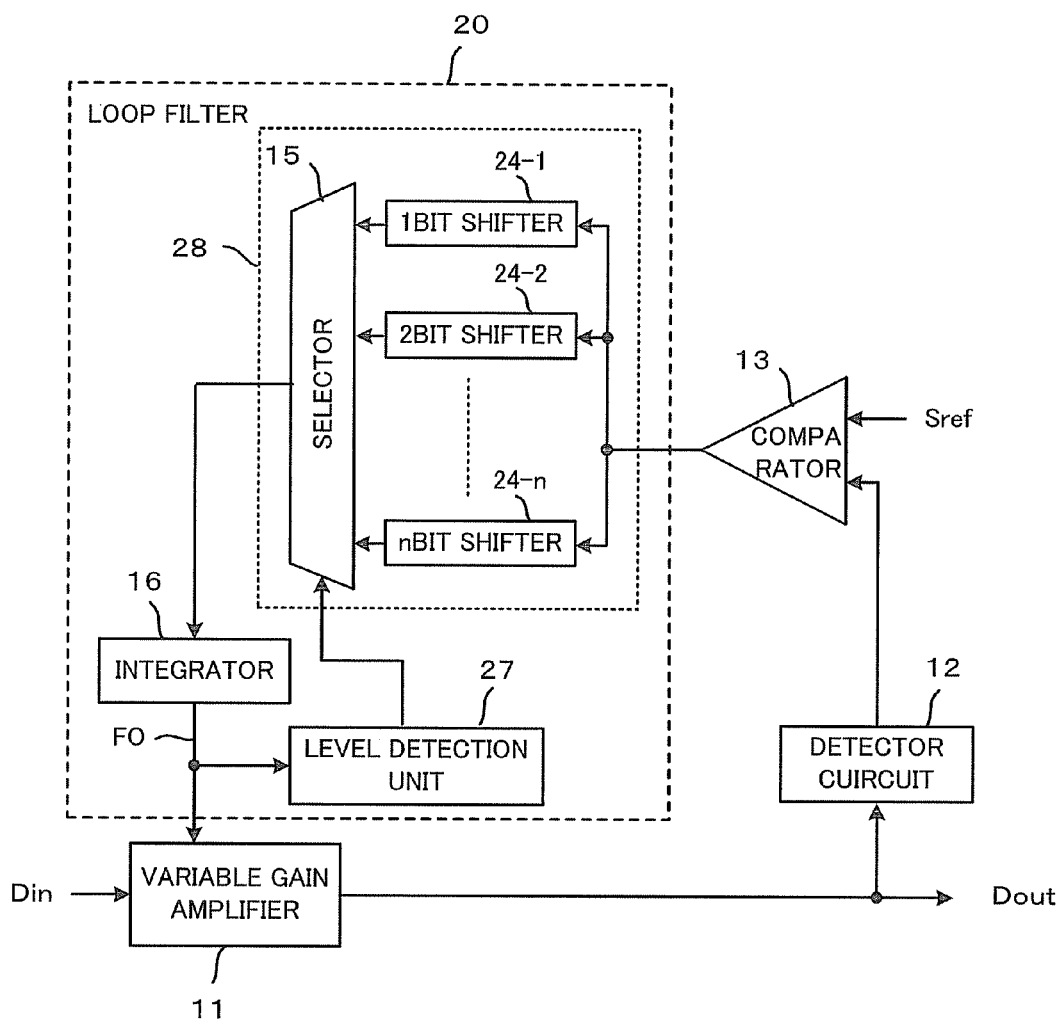
FIG. 3 is a block diagram showing a schematic configuration of an automatic gain control circuit according to a second embodiment of the invention.

FIG. 3 is a block diagram showing a schematic configuration of an automatic gain control circuit according to the second embodiment of the invention.

In FIG. 3, the automatic gain control circuit includes a loop filter 20 in place of the loop filter 10 of the automatic gain control circuit of FIG. 1. The loop filter 20 includes a level detection unit 27 and a loop gain control unit 28 in place of the level detection unit 17 and the loop gain control unit 18 of FIG. 1. The loop gain control unit 28 includes a 1-bit shifter 24-1 to an n-bit shifter 24-$n$ in place of the coefficient multipliers 14-1 to 14-$n$ of FIG. 1. The 1-bit shifter 24-1 to the n-bit shifter 24-$n$ can shift the digital output from the comparator 13 to higher order by 1 to n bits. The level detection unit 27 can detect the position of the highest bit at which the bit value of the digital output of the loop filter 20 becomes '1'.

When the output from the comparator 13 is output to the loop filter 20, the digital output from the comparator 13 is shifted to higher order by 1 to n bits in the 1-bit shifter 24-1 to the n-bit shifter 24-$n$, and the shift result is output to the selector 15.

The gain control signal FO from the loop filter 20 is output to the level detection unit 27, and the position of the highest bit at which the bit value of the gain control signal FO becomes '1' is detected. After the position of the highest bit at which the bit value of the gain control signal FO becomes '1' is detected, a selection signal corresponding to the position of the highest bit is generated, and output to the selector 15. If the bit width of the gain control signal FO is eight bits, for example, n=7 is set, and the shift amount by the 1-bit shifter 24-1 to the n-bit shifter 24-n can be selected in the following manner according to the position of the highest bit at which the bit value of the gain control signal FO becomes '1'.

'00000001' → initial data
'0000001*' → 1-bit shifter
'000001**' → 2-bit shifter
...
'1******' → 7-bit shifter Where * is 0 or 1.

When the selection signal is output to the selector 15, one of the outputs from the 1-bit shifter 24-1 to the n-bit shifter 24-n is selected according to such selection signal, and output to the integrator 16. When the signal selected by the selector 15 is output to the integrator 16, such signal is integrated to generate the gain control signal FO, which is then output to the variable gain amplifier 11 and the level detection unit 27. When the gain control signal FO is output to the variable gain amplifier 11, the gain of the variable gain amplifier 11 is controlled so that the amplitude of the output signal Dout matches the reference signal Sref.

Thus, the functions similar to the coefficient multipliers 14-1 to 14-n of FIG. 1 can be implemented by the 1-bit shifter 24-1 to n-bit shifter 24-n. Thus, the fluctuation in the response time by the intensity fluctuation of the input signal Din can be suppressed while suppressing the scale of the circuit configuration from becoming larger, and the response time until the gain of the variable gain amplifier 11 converges can be reduced while suppressing the increase of the circuit area.

Third Embodiment

A third embodiment of the invention will be described with reference to FIG. 4.

Figure 4:
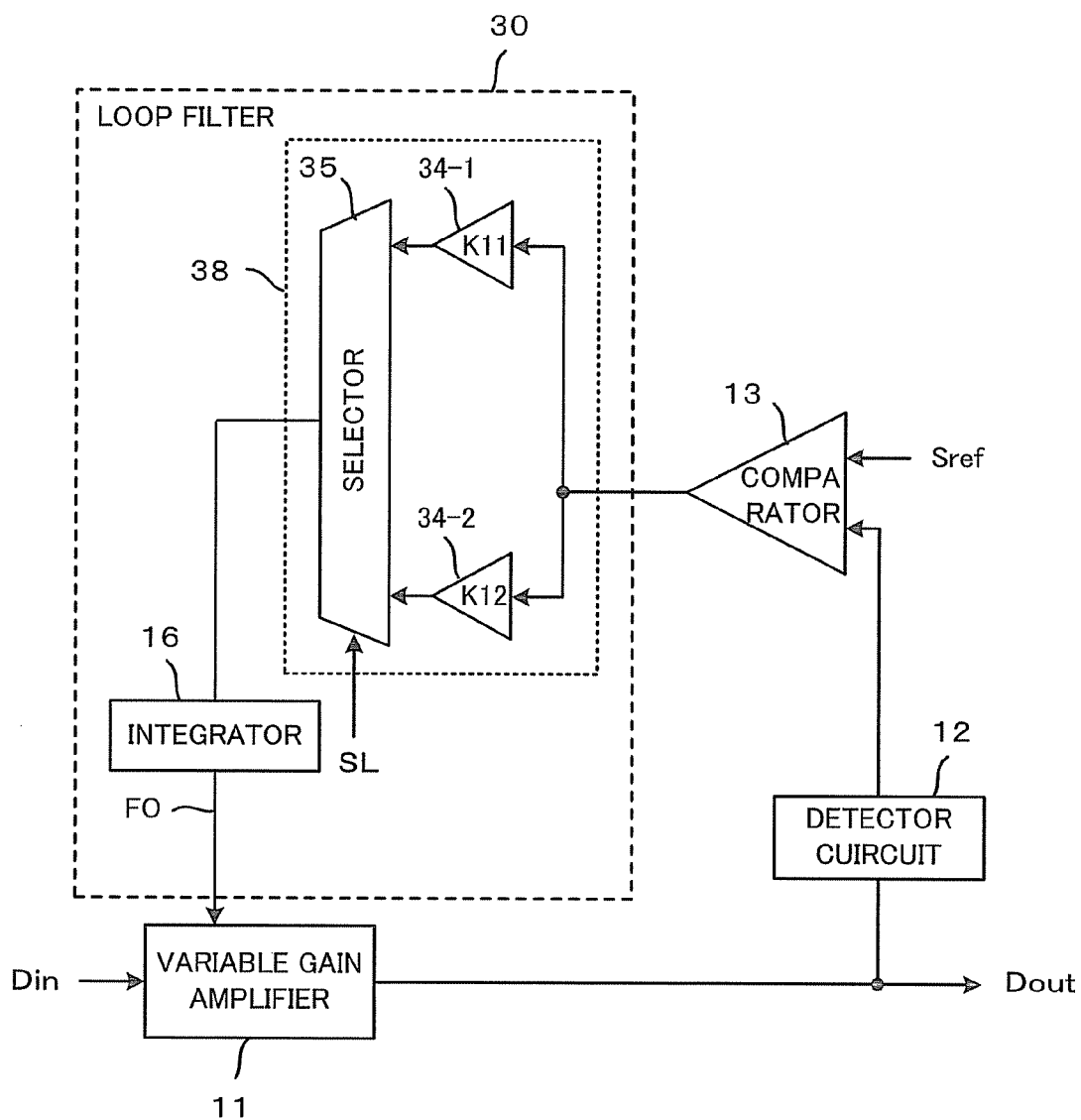
FIG. 4 is a block diagram showing a schematic configuration of an automatic gain control circuit according to a third embodiment of the invention.

FIG. 4 is a block diagram showing a schematic configuration of an automatic gain control circuit according to the third embodiment of the invention.

In FIG. 4, the automatic gain control circuit includes a loop filter 30 in place of the loop filter 10 of the automatic gain control circuit of FIG. 1. The loop filter 30 includes a loop gain control unit 38 in place of the loop gain control unit 18 of FIG. 1. The loop gain control unit 38 includes coefficient multipliers 34-1, 34-2 and a selector 35 in place of the coefficient multipliers 14-1 to 14-n and the selector 15 of FIG. 1.

The coefficient multipliers 34-1, 34-2 can multiply the filter coefficients K11, K12 to the output from the comparator 13, respectively. The selector 35 can select the filter coefficient K11, K12 to multiply to the output from the comparator 13 based on the lock detection signal SL of the PLL (Phase Locked Loop) circuit. The filter coefficients K11, K12 can be set to satisfy the condition K11>K12. The selector 35 may select the filter coefficient K11, K12 to multiply to the output from the comparator 13 based on the signal in which the lock detection signal SL of the PLL circuit is delayed in place of the lock detection signal SL of the PLL circuit.

When the output from the comparator 13 is output to the loop filter 30, the filter coefficients K11, K12 are respectively multiplied to the output from the comparator 13, and the multiplication result is output to the selector 35.

When the lock detection signal SL is input to the selector 35, either one of the outputs from the coefficient multipliers 34-1, 34-2 is selected according to the lock detection signal SL, and output to the integrator 16. The selector 35 can select the output from the coefficient multiplier 34-1 when an unlock state is input with the lock detection signal SL, and can select the output from the coefficient multiplier 34-2 when a lock state is input with the lock detection signal SL.

A case in which the unlock state is input with the lock detection signal SL can include time of power ON, time of mode switching (switching of country-by-country specification, band switching, etc.), time of frequency channel switching, or the like.

The loop gain of the loop filter 30 can be raised by selecting the output from the coefficient multiplier 34-1 when the unlock state is input with the lock detection signal SL. Thus, the gain of the automatic gain control circuit can be rapidly raised without causing failures in the normal operation of the automatic gain control circuit.

When the signal selected by the selector 35 is output to the integrator 16, such signal is integrated to generate the gain control signal FO, which is then output to the variable gain amplifier 11. When the gain control signal FO is output to the variable gain amplifier 11, the gain of the variable gain amplifier 11 is controlled so that the amplitude of the output signal Dout matches the reference signal Sref.

The response time of the feedback loop thus can be reduced with respect to various changes in the amplitude intensity of the input signal Din, and the speed of the automatic gain control circuit can be increased.

In the third embodiment described above, a method of using the coefficient multipliers 34-1, 34-2 to control the loop gain of the loop filter 30 has been described, but a bit shifter may be used as shown in FIG. 3.

Fourth Embodiment

A fourth embodiment of the invention will be described with reference to FIGS. 5 and 6.

Figure 5:
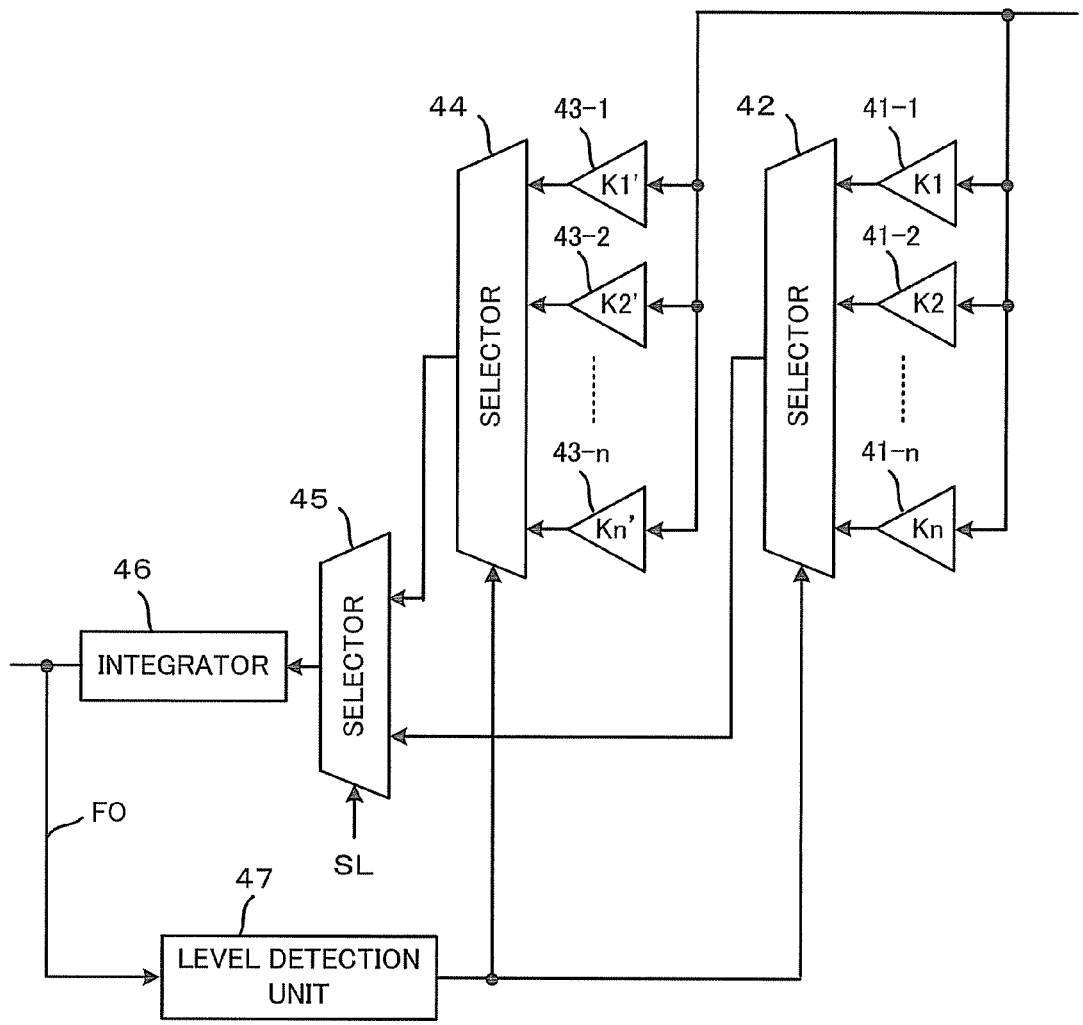
FIG. 5 is a block diagram showing a schematic configuration of a loop filter applied to an automatic gain control circuit according to a fourth embodiment of the invention.

FIG. 5 is a block diagram showing a schematic configuration of a loop filter applied to an automatic gain control circuit according to the fourth embodiment of the invention.

In FIG. 5, the loop filter includes coefficient multipliers 41-1 to 41-n, 43-1 to 43-n, selectors 42, 44, 45 (first, second, third selectors), an integrator 46, and a level detection unit 47. The loop filter may be used in place of the loop filter 10 of FIG. 1.

The coefficient multipliers 41-1 to 41-n can multiply the filter coefficients K1 to Kn to the output from the comparator 13 of FIG. 1. The coefficient multipliers 43-1 to 43-n can respectively multiply the filter coefficients K1' to Kn' to the output from the comparator 13 of FIG. 1. The selector 42 can select the filter coefficient K1 to Kn to multiply to the output from the comparator 13 based on the detection result by the level detection unit 47. The selector 44 can select the filter coefficient K1' to Kn' to multiply to the output from the comparator 13 based on the detection result by the level detection unit 47. The selector 45 can select either one of the outputs from the selectors 42, 44 based on the lock detection signal SL of the PLL circuit.

The filter coefficients K1 to Kn can be set to satisfy the condition K1<K2<K3<...<Kn. The filter coefficients K1' to Kn' can be set to satisfy the condition K1'<K2'<K3'<...<Kn'.

The integrator 46 integrates the output from the selector 45, and controls the gain of the variable gain amplifier 11 of FIG. 1 based on the integration result. The level detection unit 47 can detect the signal intensity of the output from the integrator 46.

When the output from the comparator 13 of FIG. 1 is output to the coefficient multipliers 41-1 to 41-n, 43-1 to 43-n, the filter coefficients K1 to Kn, K1' to Kn' are respectively multiplied to the output from the comparator 13, and the multiplication result is output to the selectors 42, 44, respectively.

The gain control signal FO from the integrator 46 is output to the level detection unit 47, and the signal intensity GA of the gain control signal FO is detected. After the signal intensity GA of the gain control signal FO is detected, a selection signal corresponding to such signal intensity GA is generated, and output to the selectors 42, 44. If TH1<TH2<TH3< . . . <THn−1, for example, the filter coefficients K1 to Kn, K1' to Kn' can be selected in the following manner according to the signal intensity GA of the gain control signal FO.

$$
\begin{aligned}
GA < TH1 &\rightarrow K1, K1' \\
TH1 \le GA < TH2 &\rightarrow K2, K2' \\
TH2 \le GA < TH3 &\rightarrow K3, K3' \\
&\ldots \\
THn-1 \le GA &\rightarrow Kn, Kn'
\end{aligned}
$$

When the selection signal is output to the selector 42, either one of the outputs from the coefficient multipliers 41-1 to 41-n is selected according to such selection signal, and output to the selector 45. When the selection signal is output to the selector 44, either one of the outputs from the coefficient multipliers 43-1 to 43-n is selected according to such selection signal, and output to the selector 45.

When the lock detection signal SL is input to the selector 45, either one of the outputs from the selectors 42, 44 is selected according to the lock detection signal SL, and output to the integrator 46. The selector 45 can select the output from the selector 44 when an unlock state is input with the lock detection signal SL, and can select the output from the selector 42 when a lock state is input with the lock detection signal SL.

When the signal selected by the selector 45 is output to the integrator 46, such signal is integrated to generate the gain control signal FO, which is then output to the variable gain amplifier 11 of FIG. 1. When the gain control signal FO is output to the variable gain amplifier 11, the gain of the variable gain amplifier 11 is controlled so that the amplitude of the output signal Dout matches the reference signal Sref.

Thus, the cutoff frequency of the loop filter can be stabilized and the response time of the feedback loop can be reduced even when the amplitude intensity of the input signal Din fluctuates. As a result, the stability and the high speed property can be satisfied with respect to the fluctuation in the response time due to fluctuation of the amplitude intensity of the input signal Din.

In the fourth embodiment described above, a method of using the coefficient multipliers 41-1 to 41-n, 43-1 to 43-n to control the loop gain of the loop filter has been described, but a bit shifter may be used as shown in FIG. 3.

Specifically, the Level detection unit detects the position of the highest bit at which the bit value of the digital output of the integrator becomes '1'. In the loop gain control unit, the first bit shifter determines the first shift amount based on the position of the highest bit, and shifts the digital output of the comparator by the first shift amount. The second bit shifter determines the second shift amount different from the first shift amount based on the position of the highest bit, and shifts the digital output of the comparator by the second shift amount. The third selector selects the digital output from the comparator shifted by the first shift amount or the second shift amount based on the lock detection signal of the PLL circuit.

Figure 6:
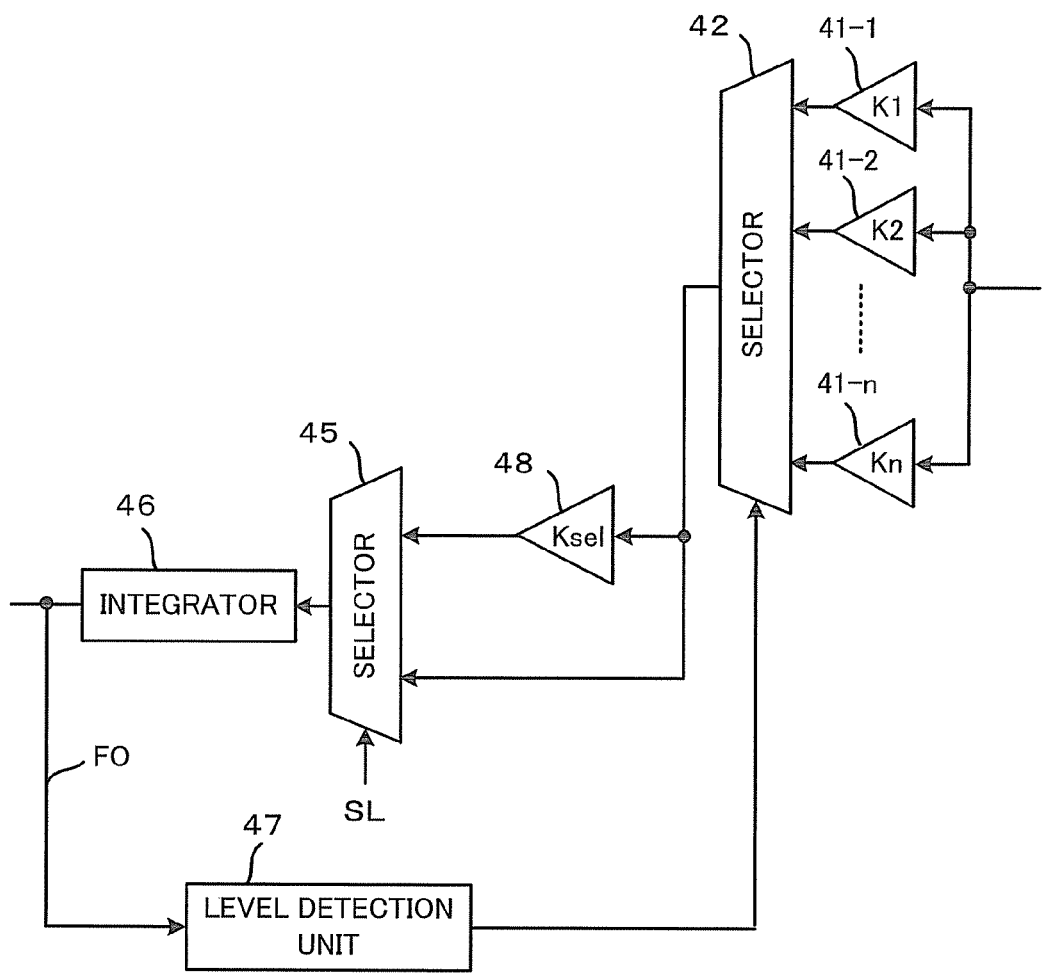
FIG. 6 is a block diagram showing a schematic configuration of a loop filter applied to another automatic gain control circuit according to the fourth embodiment of the invention.

If each filter coefficient K1 to Kn and each filter coefficient K1' to Kn' differ and the ratio of each filter coefficient K1 to Kn and each filter coefficient K1' to Kn' is constant (Ksel), one coefficient multiplier and the selector can be replaced with the coefficient multiplier of the filter coefficient Ksel as shown in FIG. 6.

In FIG. 6, the selector 44 and the coefficient multipliers 43-1 to 43-n are replaced with the coefficient multiplier 48 of the filter coefficient Ksel. The filter coefficient Ksel is the ratio (Kunlock/Klock) of the multiplication coefficient (Klock) at the time of PLL lock and the multiplication coefficient (Kunlock) at the time of PLL unlock. The path to multiply the filter coefficient Ksel is selected when detecting the PLL unlock (when the loop gain is high).

Fifth Embodiment

A fifth embodiment of the invention will be described with reference to FIG. 7.

Figure 7:
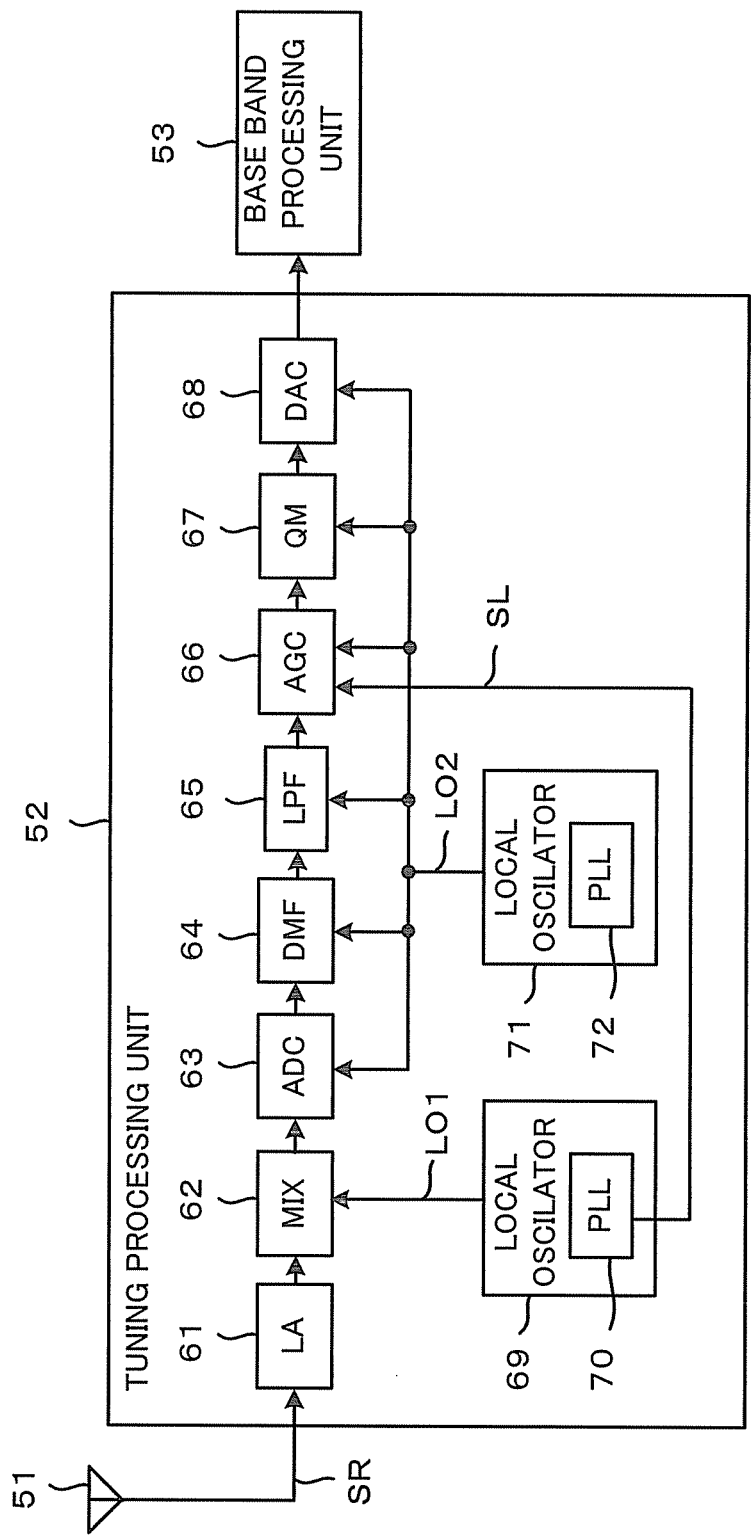
FIG. 7 is a block diagram showing a schematic configuration of a receiver circuit applied with an automatic gain control circuit according to a fifth embodiment of the invention.

FIG. 7 is a block diagram showing a schematic configuration of a receiver circuit applied with an automatic gain control circuit according to the fifth embodiment of the invention. In the following description, a receiver circuit to receive terrestrial digital broadcast will be described by way of example.

In FIG. 7, the receiver circuit includes an antenna 51, a tuning processing unit 52, and a base band processing unit 53. The tuning processing unit 52 includes a low noise amplifier 61, a mixer 62, an AD converter 63, a decimation filter 64, a low-pass filter 65, an automatic gain control circuit 66, an quadrature modulator 67, a DA converter 68, a local oscillator 69 (first local oscillator), a local oscillator 71 (second local oscillator), a PLL circuit 70 (first PLL circuit), and a PLL circuit 72 (second PLL circuit). The tuning processing unit 52 may be configured as one chip IC, and the tuning processing unit 52 and the base band processing unit 53 may be configured as one chip IC.

The low noise amplifier 61 can amplify the reception signal SR received through the antenna 51. The mixer 62 can down-convert the reception signal SR by mixing a local oscillation signal LO1 to the reception signal SR. The AD converter 63 can convert the reception signal SR down-converted in the mixer 62 to the digital signal. The decimation filter 64 can lower the sampling speed of the digital signal output from the AD converter 63. The low pass filter 65 can perform channel selection of the reception signal SR in which the sampling speed is lowered.

The automatic gain control circuit 66 can control the gain of the channel selected reception signal SR. Specifically, the lock detection signal SL of the PLL circuit 70 is input to the automatic gain control circuit 66. The automatic gain control circuit 66 can perform gain control with the loop gain of the loop filter raised when the unlock state is input with the lock detection signal SL, and can perform gain control with the loop gain of the loop filter lowered when the lock state is input with the lock detection signal SL.

The quadrature modulator 67 can perform up-conversion so that the reception signal SR in which the gain is controlled by the automatic gain control circuit 66 has a band pass with a predetermined frequency as a reference. The DA converter 68 can convert the reception signal SR up-converted by the quadrature modulator 67 to an analog signal. The local oscillator 69 can generate the local oscillation signal LO1 based on the output of the PLL circuit 70. The local oscillator 71 can generate the local oscillation signal LO2 based on the output of the PLL circuit 72.

The AD converter 63, the decimation filter 64, the low-pass filter 65, the automatic gain control circuit 66, the quadrature modulator 67, and the DA converter 68 can operate in synchronization with the clock signal generated from the local oscillation signal LO2.

The reception signal SR received through the antenna 51 is amplified at the low noise amplifier 61, and then down-converted at the mixer 62, converted to a digital signal at the AD converter 63, and input to the decimation filter 64. After the sampling speed is lowered at the decimation filter 64, the reception signal SR converted to the digital signal is channel-selected at the low pass filter 65 and input to the automatic gain control circuit 66. In the automatic gain control circuit 66, the gain of the reception signal SR channel-selected at the low pass filter 65 is controlled, while the loop gain of the loop filter is controlled based on the lock detection signal SL of the PLL circuit 70, and then output to the quadrature modulator 67.

In the quadrature modulator 67, the reception signal SR, which gain is controlled by the automatic gain control circuit 66, is up-converted to have a band pass with a predetermined frequency as a reference, and then converted to an analog signal at the DA converter 68 and output to the base band processing unit 53. In the case of the base band processing unit to execute the base band process with the digital signal, the signal is directly output from the quadrature modulator 67 to the base band processing unit. Therefore, the DA converter is unnecessary. The reception signal SR, which gain is controlled by the automatic gain control circuit 66, may be directly output to DA converter 68 or the base band processing unit 53 without quadrature modulation. Therefore, the quadrature modulator is unnecessary.

In the fifth embodiment described above, a method in which the automatic gain control circuit of FIG. 4 is applied to the receiver circuit as the automatic gain control circuit 66 has been described by way of example, but the automatic gain control circuit of FIGS. 1, 3, 5 may be applied to the receiver circuit as the automatic gain control circuit 66. In the fifth embodiment described above, a method in which the automatic gain control circuit 66 is applied to the receiver circuit has been described, but the automatic gain control circuit 66 may be applied to a transmitter circuit.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An automatic gain control circuit comprising: a variable gain amplifier configured so that a gain is varied by a first control signal;
   a detector circuit to detect an intensity of an output signal of the variable gain amplifier;
   a comparator to compare an output signal of the detector circuit with a reference signal;
   an integrator to integrate a signal corresponding to an output signal of the comparator, and output an integration result to the variable gain amplifier as the first control signal;
   a loop gain control unit, connected between the comparator and the integrator, and configured so that a loop gain is varied by a second control signal, the loop gain control unit including a plurality of coefficient multipliers to multiply filter coefficients, different from each other, to the output signal of the comparator;
   a level detection unit to detect an intensity of an output signal of the integrator, and output a detection result to the loop gain control unit as the second control signal, the level detection unit including a highest bit detection unit to detect a position of a highest bit where a bit value of a digital output of the integrator becomes '1', the loop gain control unit including a bit shifter to determine a shift amount based on the position of the highest bit, and shift the digital output of the comparator by the shift amount; and
   a selector to select the filter coefficient to multiply to the output signal of the comparator based on the detection result of the level detection unit.

2. The automatic gain control circuit according to claim 1, wherein the shift amount is m bits (m≤n) when the position of the highest bit is n-th bit.

3. The automatic gain control circuit according to claim 1, wherein the bit shifter includes,
   1-bit shifter to shift the digital output of the comparator by one bit to n-bit shifter to shift the digital output of the comparator by n bits, and
   a selector to select one of the 1-bit shifter to n-bit shifter in correspondence with the shift amount.

4. An automatic gain control circuit comprising:
   a variable gain amplifier configured so that a gain is varied by a first control signal;
   a detector circuit to detect an intensity of an output signal of the variable gain amplifier;
   a comparator to compare the output signal of the detector circuit with a reference signal;
   an integrator to integrate a signal corresponding to an output signal of the comparator, and output an integration result to the variable gain amplifier as the first control signal; and
   a loop gain control unit, connected between the comparator and the integrator, and configured so that a loop gain is varied by a lock detection signal of a PLL (phase lock loop) circuit, the loop gain control unit including two coefficient multipliers to respectively multiply different filter coefficients to the output signal of the comparator, and a selector to select the filter coefficient to multiply to the output signal of the comparator based on the lock detection signal of the PLL circuit; and
   a level detection unit to detect a signal intensity of the output of the integrator, wherein the loop gain control unit includes:
      a plurality of first coefficient multipliers to multiply first filter coefficients, different from each other, to the output signal of the comparator;
      a first selector to select the first filter coefficient to multiply to the output signal of the comparator based on the detection result of the level detection unit;
      a plurality of second coefficient multipliers to multiply second filter coefficients, different from each other, to the output signal of the comparator;
      a second selector to select the second filter coefficient to multiply to the output signal of the comparator based on the detection result of the level detection unit; and
      a third selector to select the first filter coefficient selected by the first selector or the second filter coefficient selected by the second selector based on the lock detection signal of the PLL circuit.

5. The automatic gain control circuit according to claim 4, wherein each of the first filter coefficients and each of the second filter coefficients differ and the ratio of each of the first filters coefficient and each of the second filter coefficient is constant.

6. The automatic gain control circuit according to claim 4, comprising a level detection unit to detect a signal intensity of the output of the integrator, wherein the loop gain control unit includes:
   a plurality of first coefficient multipliers to multiply first filter coefficients, different from each other, to the output signal of the comparator;
   a first selector to select the first filter coefficient to multiply to the output signal of the comparator based on the detection result of the level detection unit;
   a second coefficient multiplier to multiply a second filter coefficient to the output signal of the comparator; and
   a second selector to select the first filter coefficient selected by the first selector or the second filter coefficient based on the lock detection signal of the PLL circuit.

7. The automatic gain control circuit according to claim 4, comprising a level detection unit to detect a position of a highest bit where a bit value of a digital output of the integrator becomes '1', wherein the loop gain control unit includes:
   a first bit shifter to determine a first shift amount based on the position of the highest bit, and shift the digital output of the comparator by the first shift amount;
   a second bit shifter to determine a second shift amount different from the first shift amount based on the position of the highest bit, and shift the digital output of the comparator by the second shift amount; and
   a selector to select the digital output of the comparator shifted by the first shift amount or the second shift amount based on the lock detection signal of the PLL circuit.

8. A receiver circuit comprising:
   a low noise amplifier to amplify a reception signal;
   a first local oscillator to generate a first local oscillation signal based on an output of a first PLL (phase lock loop) circuit;
   a mixer to down-convert the reception signal by mixing the reception signal and the first local oscillation signal;
   a second local oscillator to generate a second local oscillation signal based on an output of a second PLL (phase lock loop) circuit;
   an AD (Analog to Digital) converter, to operate in synchronization with a clock signal generated from the second local oscillation signal, and convert an analog signal down-converted by the mixer to a digital signal; and
   an automatic gain control circuit to operate in synchronization with the clock signal generated from the second local oscillation signal, and control a gain of the digital signal output from the AD converter while controlling a loop gain of a feedback loop based on a lock detection signal of the first PLL circuit, the automatic gain control circuit including a variable gain amplifier configured so that a gain is varied by a first control signal, a detector circuit to detect an intensity of an output signal of the variable gain amplifier, a comparator to compare an output signal of the detector circuit with a reference signal, a loop filter to feed back an output signal of the comparator to the variable gain amplifier, an integrator, a level detection circuit to detect a signal intensity of an output of the integrator and a loop gain control unit, wherein the loop gain control unit includes:
   a plurality of first coefficient multipliers to multiply first filter coefficients, different from each other, to an output signal of the comparator;
   a first selector to select the first filter coefficient to multiply to the output signal of the comparator based on the detection result of the level detection unit;
   a second coefficient multiplier to multiply a second filter coefficient to the output signal of the comparator; and
   a second selector to select the first filter coefficient selected by the first selector or the second filter coefficient based on the lock detection signal of the PLL circuit.

9. The receiver circuit according to claim 8, wherein the loop filter includes,
   the integrator to integrate a signal corresponding to the output signal of the comparator, and output an integration result to the variable gain amplifier as the first control signal, and a
   loop gain control unit, connected between the comparator and the integrator, and configured so that a loop gain is varied by a lock detection signal of the first PLL circuit.

10. The receiver circuit according to claim 9, wherein the loop gain control unit contains,
   two coefficient multipliers to respectively multiply different filter coefficients to the output signal of the comparator, and
   a selector to select the filter coefficient to multiply to the output signal of the comparator based on the lock detection signal of the first PLL circuit.

11. The receiver circuit according to claim 9, comprising a level detection unit to detect a signal intensity of the output of the integrator, wherein the loop gain control unit includes:
   a plurality of first coefficient multipliers to multiply first filter coefficients, different from each other, to the output signal of the comparator;
   a first selector to select the first filter coefficient to multiply to the output signal of the comparator based on the detection result of the level detection unit;
   a plurality of second coefficient multipliers to multiply second filter coefficients, different from each other, to the output signal of the comparator; a second selector to select the second filter coefficient to multiply to the output signal of the comparator based on the detection result of the level detection unit; and
   a third selector to select the first filter coefficient selected by the first selector or the second filter coefficient selected by the second selector based on the lock detection signal of the PLL circuit.

* * * * *